United States Patent
Tseng et al.

(10) Patent No.: US 11,372,459 B2
(45) Date of Patent: Jun. 28, 2022

(54) FASTENER FOR SECURING INTERFACE CARD

(71) Applicant: HANWIT PRECISION INDUSTRIES LTD., New Taipei (TW)

(72) Inventors: Ying-Chih Tseng, New Taipei (TW); Ching-Kai Chang, New Taipei (TW)

(73) Assignee: HANWIT PRECISION INDUSTRIES LTD., New Taipei (TW)

( * ) Notice: Subject to any disclaimer, the term of this patent is extended or adjusted under 35 U.S.C. 154(b) by 38 days.

(21) Appl. No.: 16/950,550

(22) Filed: Nov. 17, 2020

(65) Prior Publication Data

US 2021/0064102 A1    Mar. 4, 2021

Related U.S. Application Data

(63) Continuation-in-part of application No. 16/580,359, filed on Sep. 24, 2019, now Pat. No. 11,018,452.

(30) Foreign Application Priority Data

Jan. 28, 2019   (TW) ................................ 108103114

(51) Int. Cl.

| | |
|---|---|
| *H05K 3/00* | (2006.01) |
| *H05K 3/30* | (2006.01) |
| *H05K 7/14* | (2006.01) |
| *H01R 12/00* | (2006.01) |
| *H01R 12/52* | (2011.01) |

(Continued)

(52) U.S. Cl.
CPC ........... *G06F 1/185* (2013.01); *H05K 7/1404* (2013.01); *H05K 7/1405* (2013.01)

(58) Field of Classification Search
CPC ............ H05K 3/00; H05K 3/061; H05K 3/30; H05K 3/301; H05K 3/361; H05K 7/14; H05K 7/142; H05K 7/1404; H05K 7/1405; H05K 7/20509; H01R 12/00; H01R 12/52; H01R 12/73; H01R 12/79; H01R 12/707;
(Continued)

(56) References Cited

U.S. PATENT DOCUMENTS

| | | | | |
|---|---|---|---|---|
| 5,984,293 | A * | 11/1999 | Abrahamson | .......... B23Q 1/035 269/236 |
| 6,235,991 | B1 * | 5/2001 | Johnson | ............... H05K 3/0061 174/138 D |

(Continued)

*Primary Examiner* — Xiaoliang Chen
(74) *Attorney, Agent, or Firm* — Muncy, Geissler, Olds & Lowe, P.C.

(57) ABSTRACT

A fastener includes a base having a joint plate extended therefrom toward a first direction, a joint plate extended from the joint plate toward a second direction and configured to secure to an electronic base board, and a fastening member protruded thereon toward a third direction. The fastener includes an elastic compressive unit connected to the joint plate and including a pushing part configured to abut with a circuit board downwardly rotated. Subject to the stress in the first direction and applied by the circuit board, the pushing part is moved back and the elastically-compressive unit is compressed to make the circuit board rotate to the bottom side of the pushing part, and an edge of the circuit board can be inserted into and abutted thereon the fastening member, and the circuit board is accommodated in a fastening space formed on the outside of the fastening member.

10 Claims, 9 Drawing Sheets

(51) Int. Cl.
    *H01R 12/73*     (2011.01)
    *H01R 12/79*     (2011.01)
    *B25B 1/00*     (2006.01)
    *B25B 1/24*     (2006.01)
    *G06F 1/18*     (2006.01)

(58) Field of Classification Search
    CPC ........... B25B 1/00; B25B 1/24; B25B 1/2421; B25B 11/00
    USPC ...... 361/748, 719; 439/65, 66, 67, 331, 567; 174/70 R, 138 D, 138 G, 252; 269/236, 269/266, 267
    See application file for complete search history.

(56) References Cited

U.S. PATENT DOCUMENTS

| | | | |
|---|---|---|---|
| 6,790,048 B2* | 9/2004 | Goodwin | H01R 12/52 439/331 |
| 7,760,509 B1* | 7/2010 | Zhao | H05K 7/20509 361/719 |
| 2004/0053529 A1* | 3/2004 | Kato | H05K 3/301 439/567 |
| 2012/0270421 A1* | 10/2012 | Sun | H05K 3/361 439/66 |

\* cited by examiner

FASTENER FOR SECURING INTERFACE CARD

This application is a Continuation-In-Part of application Ser. No. 16/580,359, filed on Sep. 24, 2019, for which priority is claimed under 35 U.S.C. § 120, the entire contents of which are hereby incorporated by reference.

This application claims the priority benefit of Taiwan patent application number 108103114, filed on Jan. 28, 2019.

BACKGROUND OF THE INVENTION

1. Field of the Invention

The present invention provides a fastener for securing an interface card. More particularly, the present invention provides to a quickly fastening and detaching structure for a circuit board or an interface card.

2. Description of the Related Art

In recent years, the rapid development of the electronics industry has doubled the computing performance of computers or servers. The main components of the computer include a motherboard, a central processing unit, a memory and a storage device; the motherboard also has many connectors of different interfaces for expansion of various peripherals. The expansion of peripheral can be performed by plugging an interface card, which has electronic components and corresponding circuit layouts thereon and is equipped with metal contacts on an end thereof, into the connector on the motherboard, to electrical connect the interface card and the motherboard, thereby achieving the purpose of expanding the function of the motherboard.

A general mobile electronic device (such as a notebook computer) has too small internal space to dispose various components like personal computers, especially the space formed by the C and D side cases of the notebook computer for accommodating the motherboard and related components is limited by the thickness, so the motherboard and the interface card cannot be assembled vertically like a personal computer. Therefore, the motherboard and the interface card inside the notebook must be assembled horizontally through a turning connector; when one end of the interface card is inserted into the turning connector, the other end of interface card is in a suspending state, and the suspending end of the interface card is usually mounted and locked on the motherboard by a screw, so as to form a stable and unshakable state. However, the screw locking structure is disadvantageous to detach the interface card from the motherboard, and the metal screw may accidentally fall on the motherboard to cause the short circuit of the motherboard when being loosed during disassembly process or subject to by an external force, it may damage the electronic components. Therefore, it is necessary to develop a faster to solve the above-mentioned problem.

SUMMARY OF THE INVENTION

In order to solve the conventional problems, the inventors develop a fastener for securing an interface card according to collected data, multiple evaluations and tests, and years of research experience in the industry.

An objective of the present invention is to provide a fastener for securing an interface card, and the fastener includes a base, an elastically-compressive unit, and a pushing part. The base includes a joint plate extended therefrom toward a first direction, a securing unit extended from the joint plate toward a second direction and configured to secure to an electronic base board, and a fastening member protruded thereon toward a third direction. The elastically-compressive unit is connected to the joint plate of the base. The pushing part is extended on a side of the elastically-compressive unit and configured to be pushed by a circuit board downwardly rotated. Subject to a stress in the first direction and applied by the circuit board, the pushing part is moved back and the elastically-compressive unit is compressed to make the circuit board rotate to a bottom side of the pushing part, an edge of the circuit board is inserted and fastened in the fastening member, and the fastening member forms a fastening space on the outside thereof and configured for the circuit board to accommodate therein. By using the quickly fastening and detaching structure for the circuit board or the interface card, and the fastener made by insulative elastic material, when the fastener is fallen carelessly on the electronic base board or the circuit board, the fastener does not cause short circuit and damage the electronic component, so as to provide excellent safety.

Another objective of the present invention is that the base includes an abutting plate disposed thereon and toward a direction opposite to the first direction, the abutting plate comprises an abutting protrusion disposed on a bottom side thereof and configured to abut an upper surface of the electronic base board, to form an abutting and fastening structure for the fastener and the electronic base board.

Another objective of the present invention is that the securing unit includes a securing pin and a plurality of wing plates, the securing pin and the plurality of wing plates are configured to insert into, rotate and fasten in a fastening rotation hole of the electronic base board, and the securing unit comprises a clamping slot formed between the plurality of wing plates and the base and configured to clamp the electronic base board.

Another objective of the present invention is that the elastically-compressive unit includes an elastic plate connected to the pushing part, a pushing plate downwardly bent from the elastic plate and then extended toward the first direction and then extended and bent upwardly, an elastic space formed between the elastic plate and the pushing plate, fastening pins protruded on opposite inner sidewalls of the elastic plate and the pushing plate respectively, and an elastic device mounted on the two fastening pin and comprising a spring.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
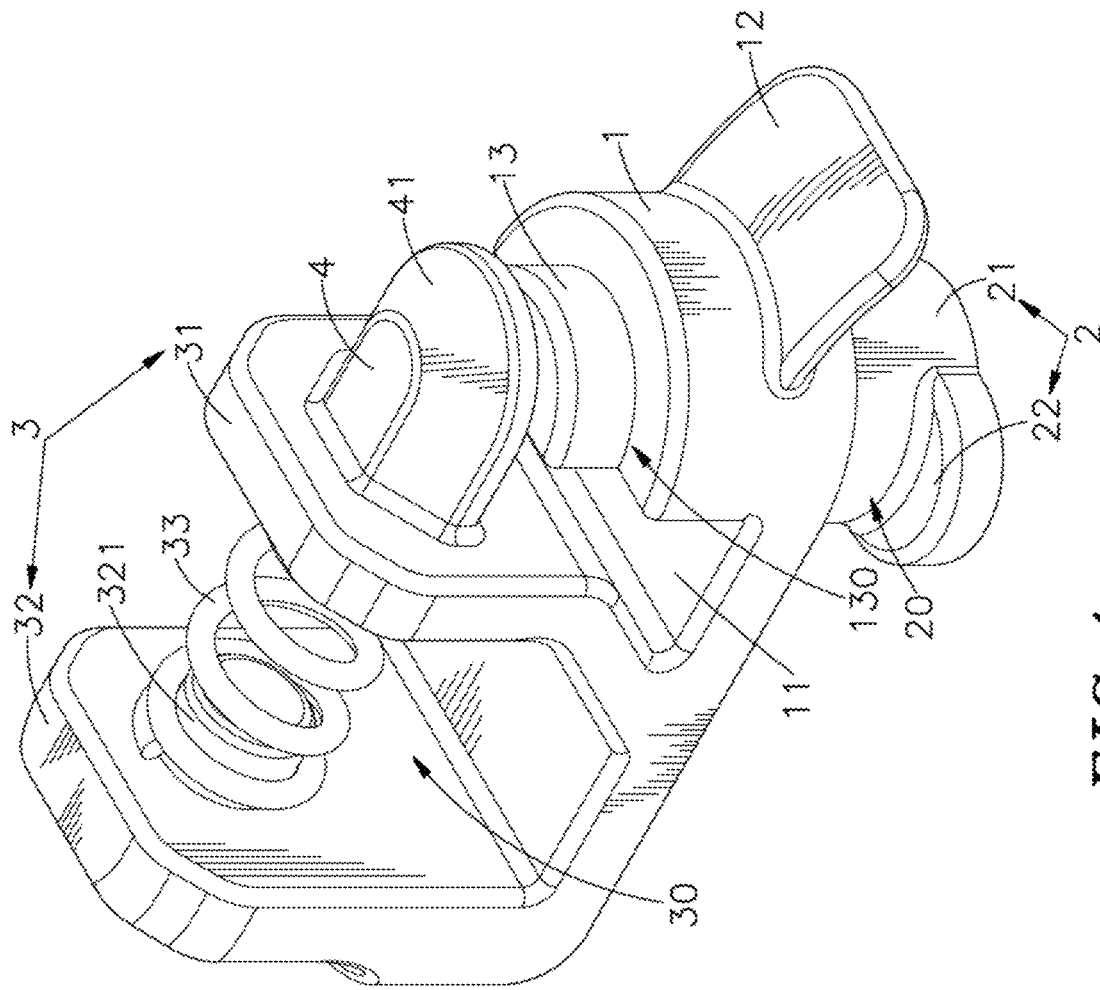
FIG. 1 is a perspective view of a fastener for securing an interface card, according to the present invention.
Figure 1:
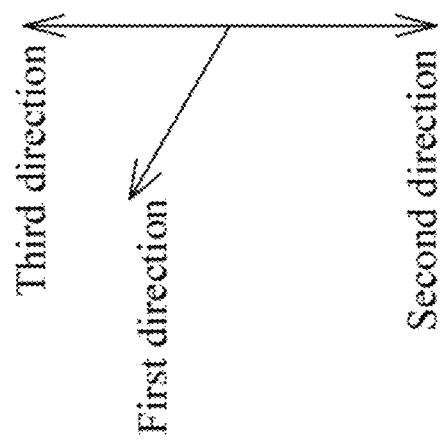
Figure 2:
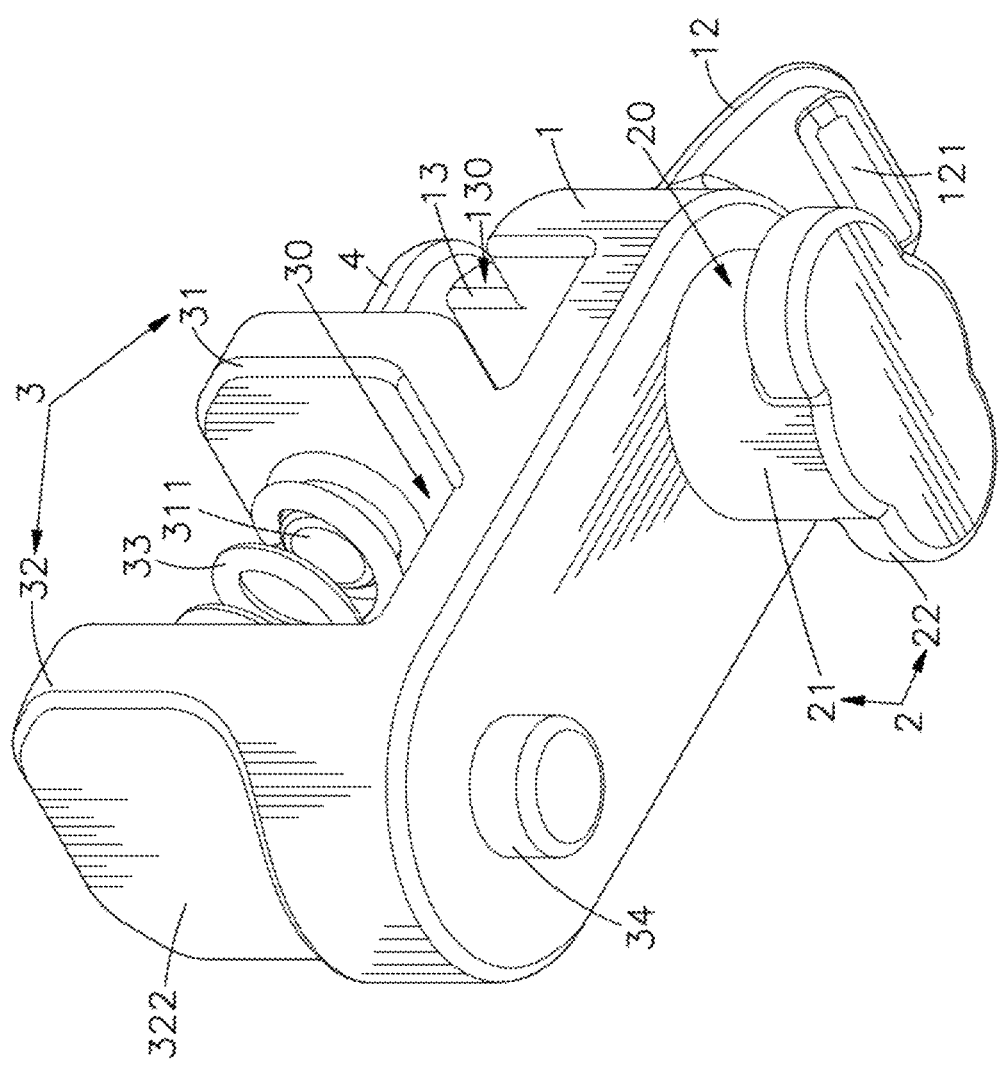
FIG. 2 is another perspective view of a fastener for securing an interface card, according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Please refer to FIGS. 1 to 7, which are a perspective view, another perspective view and a perspective exploded view of a fastener of the present invention, and diagrams showing first to fourth operations of using the fastener of the present invention. The fastener of the present invention includes a base 1, a securing unit 2, an elastically-compressive unit 3, and a pushing part 4. The fastener can be made by insulative elastic material such as elastic plastic or rubber, and in a one-piece structure. The main components and features of the fastener for securing the interface card are described in following paragraphs.

The base 1 includes a joint plate 11 extended therefrom toward a first direction, and the securing unit 2 extended therefrom toward a second direction and configured to secure to an electronic base board 5.

The elastically-compressive unit 3 is connected to the joint plate 11 of the base 1, and includes the pushing part 4 extended from a side thereof and configured to abut with a circuit board 6 downwardly rotated. For example, the circuit board 6 can be a storage interface card with M.2 or SATA interface and related circuit board. Subject to the stress in the first direction and applied by the circuit board 6, the pushing part 4 is moved back and the elastically-compressive unit 3 is compressed to allow the circuit board 6 to rotate and insert to a bottom side of the pushing part 4. The base 1 further includes a fastening member 13 protruded thereon toward a third direction and configured for the edge of the circuit board 6 to insert therein and abutted thereon. A fastening space 130 is formed on the outside of the fastening member 13 to accommodate the circuit board 6. The first direction, the second direction and the third direction are perpendicular to each other, and the third direction is opposite to the second direction.

The base 1 includes an abutting plate 12 disposed thereon toward a direction opposite to the first direction; the abutting plate 12 includes an abutting protrusion 121 disposed on a bottom side thereof and configured to abut an upper surface of the electronic base board 5, so as to form an abutting and fastening structure for the fastener and the electronic base board 5.

The fastening member 13 can be a semicircular arc-sheet-shaped body, and the circuit board 6 has a semicircular fastening groove 60 corresponding in position to the fastening member 13. The fastening member 13 can be abutted with the fastening groove 60 on a suspending board side of the circuit board 6 for fastening, so as to form a fastening structure for the fastener and the circuit board 6.

The securing unit 2 includes a securing pin 21 and a plurality of wing plates 22; in this embodiment, two wing plates 22 are disposed on two symmetrical sides of the securing pin 21, but the present invention is not limited thereto. The securing pin 21 and the wing plates 22 can be inserted into, rotated and fastened in a fastening rotation hole 50 of the electronic base board 5, so that the electronic base board 5 can be clamped between the base 1 and the wing plates 22. In an embodiment, the rotary fastening operation is to rotate the fastener a preset angle, and in a preferred embodiment, the preset angle is 90°; in other application, the preset angle can be 45°, 60°, 105°, 120° or other angle. Furthermore, a clamping slot 20 can be formed between the wing plates 22 and the base 1 to clamp the electronic base board 5. The abutting protrusion 121 of the abutting plate 12, the securing unit 2, and a fastening protrusion 34 on the bottom side of the elastically-compressive unit 3 can be fastened on or abutted with the electronic base board 5 at the same time, so as to form a stable three-point-collinear structure.

The elastically-compressive unit 3 includes an elastic plate 31 connected to the pushing part 4, a pushing plate 32 downwardly bent from the elastic plate 31 and then extended toward the first direction and then extended and bent upwardly, an elastic space 30 formed between the elastic plate 31 and the pushing plate 32, fastening pins 311 and 321 protruded on opposite inner sidewalls of the elastic plate 31 and the pushing plate 32 respectively, and an elastic device 33 mounted between the two fastening pins 311 and 321 and including a spring. The configuration of the elastic device 33 can prevent the elastic plate 31 or the pushing plate 32 from being broken subject to excessive stress applied on the pushing plate 32. Besides the elastic recovery function, the elastic device 33 can also provide stress buffer.

The pushing plate 32 has a pushing surface 322 recessed on an outer side thereof, and the fastening protrusion 34 disposed on a bottom side of the pushing plate 32 and configured to insert to a fastening hole 51 of the electronic base board 5.

The pushing part 4 has a guiding incline 41 formed on a top side thereof and configured to guide the circuit board 6 to downwardly rotate; in an embodiment, the guiding incline 41 can be in a circular-arc shape, but the guiding incline 41 of the present invention is not limited in shape, for example, the guiding incline 41 with a beveled surface is also within the spirit and scope of the disclosure set forth in the claims.

The electronic base board 5 includes an electric connector 7 disposed thereon and configured to provide the circuit board 6 to plug thereon, so as to electrically connect the electronic base board 5 and the circuit board 6.

Figure 3:
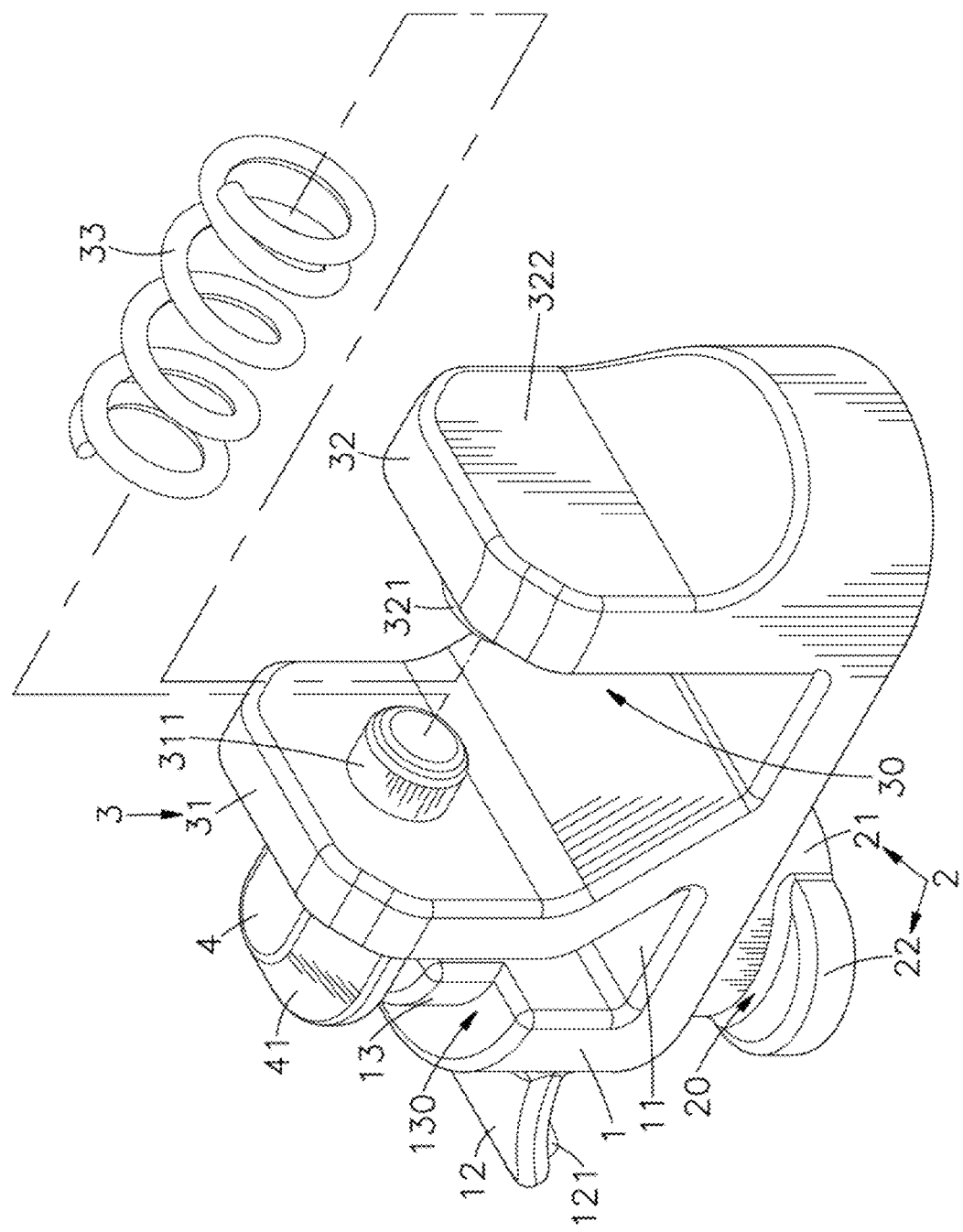
FIG. 3 is a perspective exploded view of a fastener for securing an interface card, according to the present invention.
Figure 4:
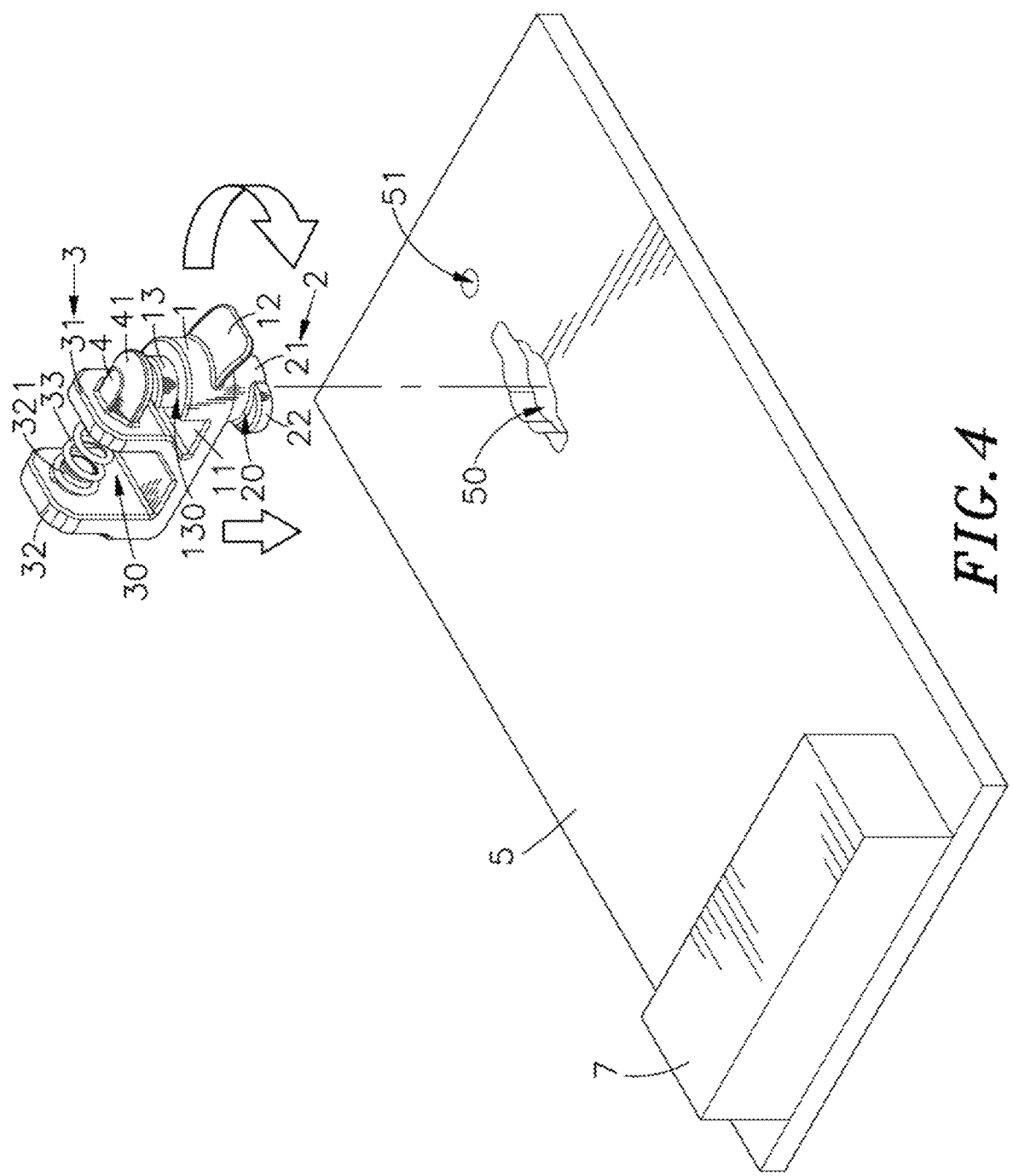
FIG. 4 is a diagram showing a first operation of using a fastener of the present invention.
Figure 5:
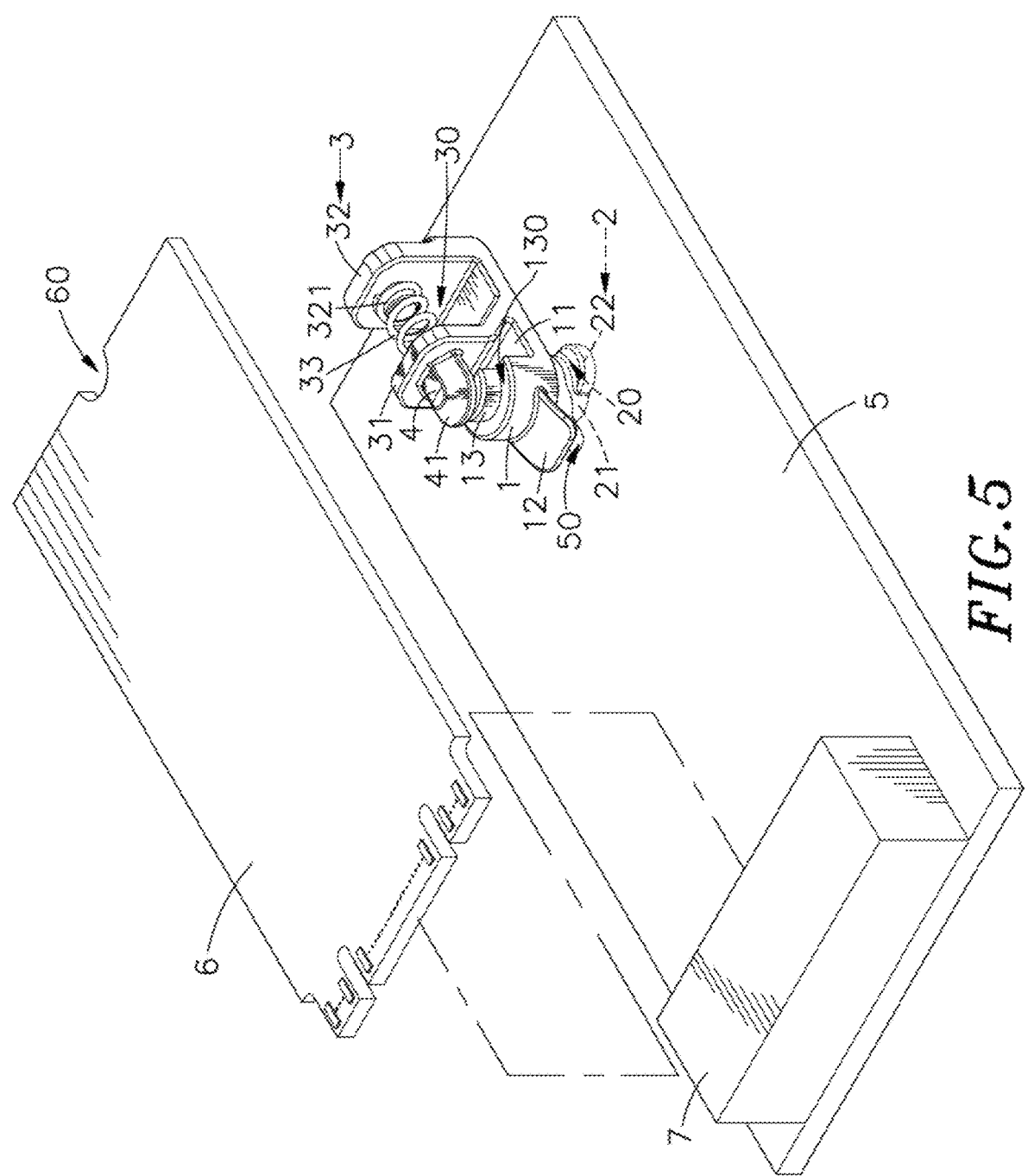
FIG. 5 is a diagram showing a second operation of using the fastener of the present invention.
Figure 6:
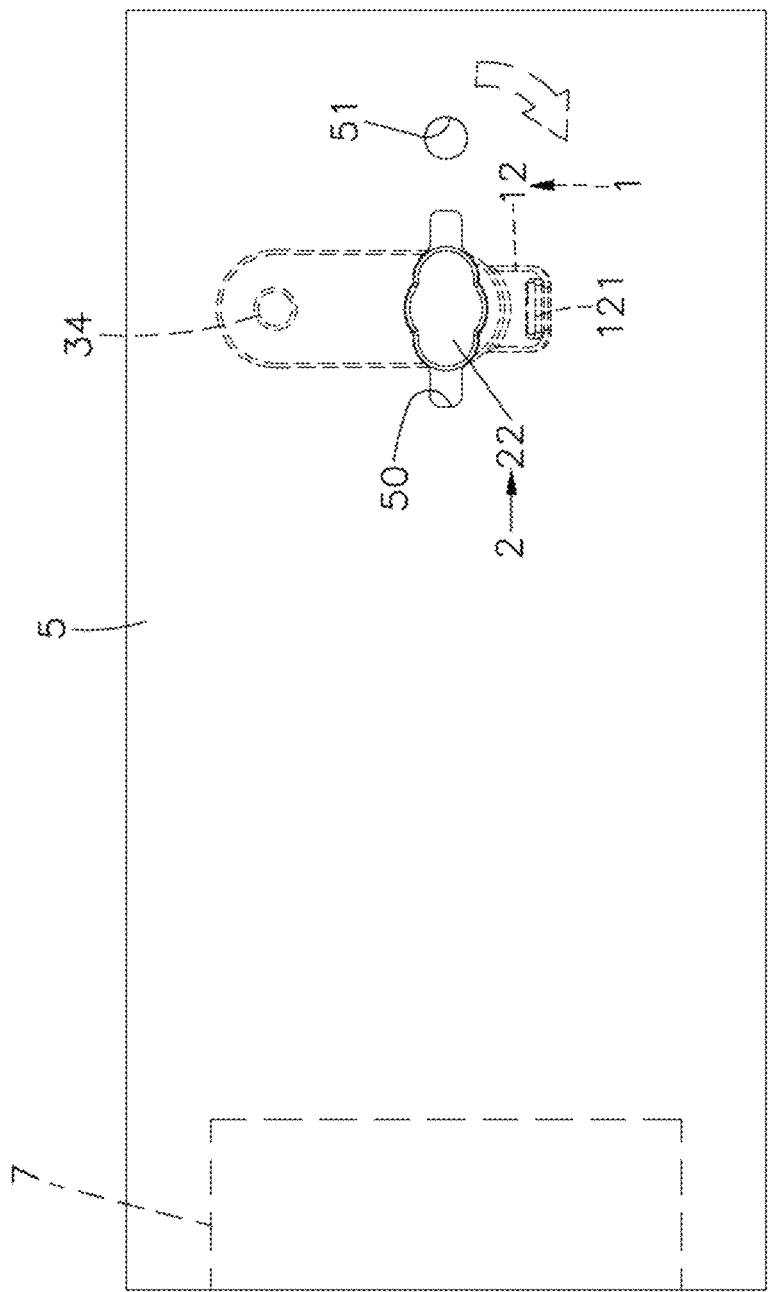
FIG. 6 is a diagram showing a third operation of using the fastener of the present invention.
Figure 7:
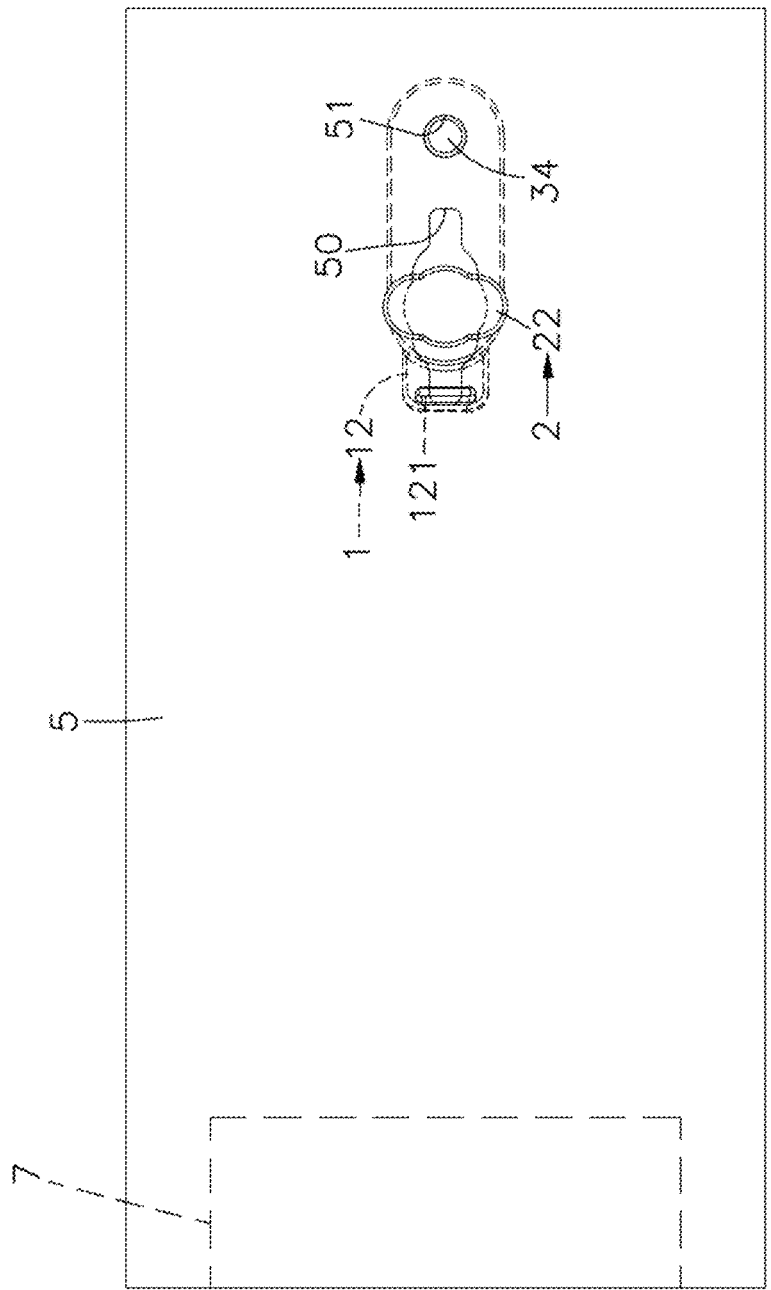
FIG. 7 is a diagram showing a fourth operation of using the fastener of the present invention.
Figure 8:
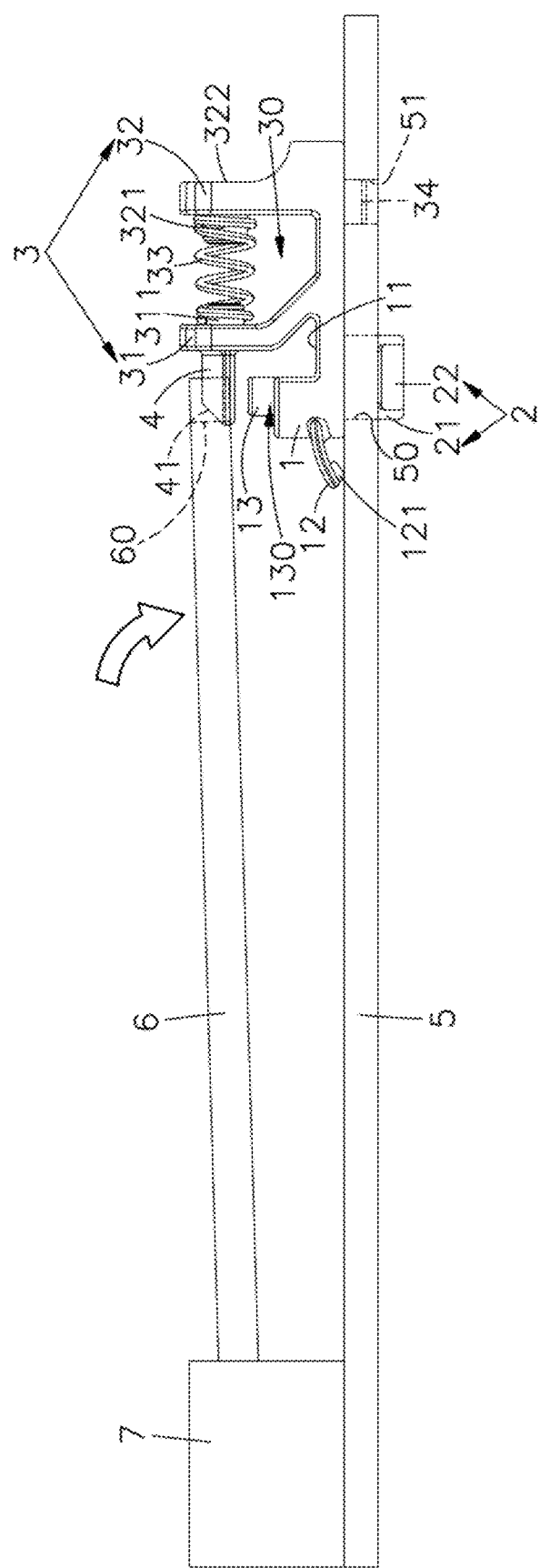
FIG. 8 is a diagram showing a first operation of engaging a circuit board into a fastener of the present invention.
Figure 9:
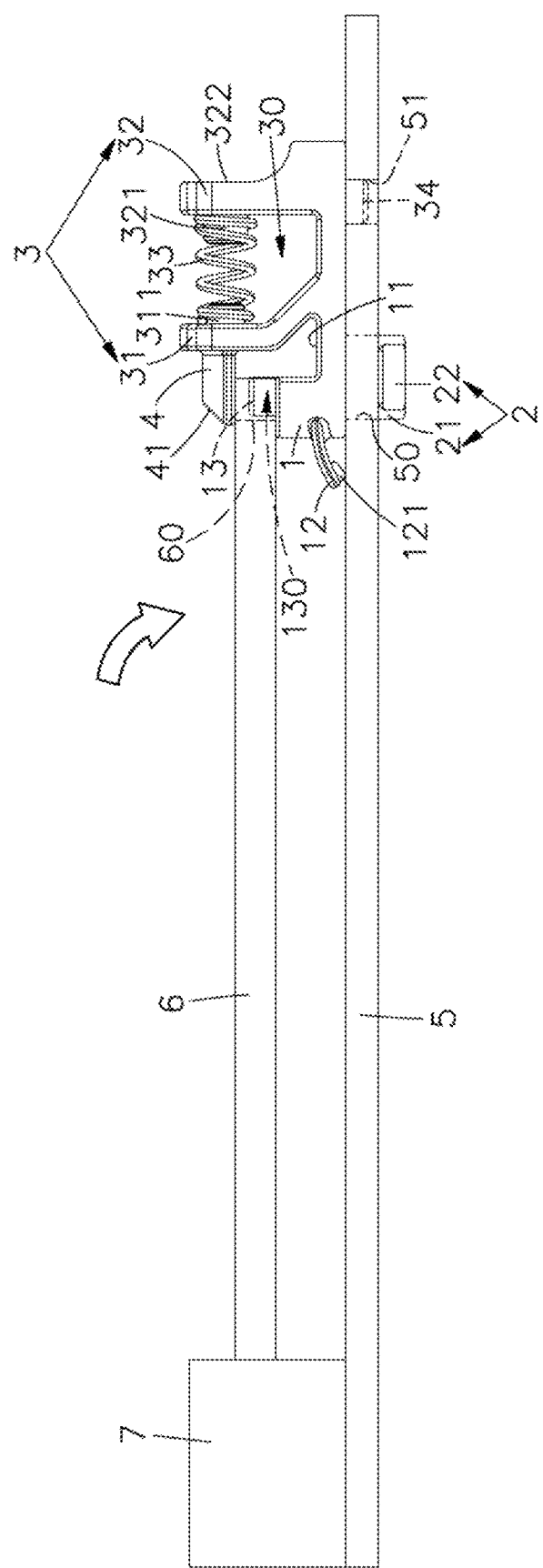
FIG. 9 is a diagram showing a second operation of engaging the circuit board into the fastener of the present invention.

Please refer to FIG. 3. The fastener can be in a one-piece structure, so the user just needs to engage the two ends of the elastic device 33 into and between the fastening pin 311 of the elastic plate 31 and the fastening pin 321 of the pushing plate 32, to complete the assembly of the fastener. The fastener of the present invention can be assembled in a method which is very convenient and beneficial for quick mass production.

Please refer to FIGS. 4 to 9, which are diagrams showing the first to four operations of using the fastener of the present invention, and diagrams of first and two operations of engaging the circuit board into the fastener of the present invention. In order to assemble the fastener with the electronic base board 5, the securing pin 21 and the wing plates 22 of the fastener are inserted into the fastening rotation hole 50 of the electronic base board 5 and then rotated 90° in a clockwise or counterclockwise direction for fastening, so that the electronic base board 5 can be clamped between the base 1 and the wing plates 22, and at the same time the fastening protrusion 34 on the bottom side of the elastically-compressive unit 3 is engaged in the fastening hole 51 of the electronic base board 5, and the abutting protrusion 121 of the abutting plate 12 is abutted with the upper surface of the electronic base board 5, therefore, the electronic base board 5 can be clamped in the clamping slot 20 of the securing unit 2 to form a three-point-collinear securing status. The electronic base board 5 includes the electric connector 7 disposed thereon, the circuit board 6 can be plugged in the electric connector 7 for electric connection, and the suspending end of the circuit board 6 is secured by the fastener.

In order to secure the suspending end of the circuit board 6 in the fastener, the circuit board 6 is turned about the electric connector 7 toward the pushing part 4 of the fastener, and the pushing part 4 is pressed to move back by the stress of the circuit board 6 in the first direction (that is, the horizontal direction), the elastic plate 31 is moved toward the pushing plate 32 to form a bent deformation in a small magnitude and also makes the elastic device 33 compressively deform, so that the circuit board 6 can be downwardly rotated vertically to the bottom side of the pushing part 4 and into the fastening space 130. The semicircular-arc-sheet-shaped fastening member 13 is disposed in the fastening space 130 to abut with the fastening groove 60 of the circuit board 6 for securing. After the circuit board 6 is rotated into the fastening space 130, the pushing part 4, the elastic plate 31, the pushing plate 32 and the elastic device 33 are moved back to original positions, so as to form a securing structure for the fastener and the circuit board 6.

In order to detach the circuit board 6 from the fastener, the user just needs to press the outer side of the elastic plate 31 and the pushing surface 322 of the pushing plate 32, to move the elastic plate 31 toward the pushing plate 32 and make the elastic device 33 compressively deform, and at this time the circuit board 6 can be upwardly rotated to separate from the fastening member 13, after the force applied on the elastic plate 31 and the pushing plate 32 is released, the elastic device 33 springs back to the status before being compressed, and the pushing part 4, the elastic plate 31 and the pushing plate 32 are moved back to original position, so as to complete operation of the fastener of the present invention.

According to illustrations with reference to FIGS. 1 to 9, the fastener of the present invention includes the base and the elastic-compressive unit. The base includes the joint plate extended therefrom toward the first direction, the securing unit extended from the joint plate toward the second direction and configured to secure to the electronic base board, and the fastening member protruded thereon toward the third direction. The elastic-compressive unit is connected to the joint plate and includes the pushing part extended on the side thereof and configured to abut with the circuit board downwardly rotated. Subject to the stress in the first direction and applied by the circuit board, the pushing plate is moved back and the elastically-compressive unit is compressed to make the circuit board rotate into the bottom side of the pushing part. The edge of the circuit board can be inserted into and abutted on the fastening member, the fastening space formed outside the fastening member can accommodate the circuit board. By using the quickly fastening and detaching structure for the circuit board or the interface card, and the fastener made by insulative elastic material, when the fastener is fallen carelessly on the electronic base board or the circuit board, the fastener does not cause short circuit and damage the electronic component, so as to provide excellent safety. Therefore, the fastener of the present invention has excellent practicability when being applied to the assembly of interface card.

The present invention disclosed herein has been described by means of specific embodiments. However, numerous modifications, variations and enhancements can be made thereto by those skilled in the art without departing from the spirit and scope of the disclosure set forth in the claims.

What is claimed is:
1. A fastener for securing an interface card, comprising:
a base comprising a joint plate extended therefrom toward a first direction, a securing unit extended from the joint plate toward a second direction and configured to secure to an electronic base board, and a fastening member protruded thereon toward a third direction;
an elastically-compressive unit connected to the joint plate of the base;
a pushing part extended on a side of the elastically-compressive unit and configured to be pushed by a circuit board downwardly rotated, wherein subject to a stress in the first direction and applied by the circuit board, the pushing part is moved back and the elastically-compressive unit is compressed to make the circuit board rotate to a bottom side of the pushing part, an edge of the circuit board is inserted and fastened in the fastening member, and the fastening member forms a fastening space on an outside thereof and configured for the circuit board to accommodate therein.

2. The fastener according to claim 1, wherein the base comprises an abutting plate disposed thereon and toward a direction opposite to the first direction, the abutting plate comprises an abutting protrusion disposed on a bottom side thereof and configured to abut an upper surface of the electronic base board, to form an abutting and fastening structure for the fastener and the electronic base board.

3. The fastener according to claim 1, wherein the securing unit comprises a securing pin and a plurality of wing plates, the securing pin and the plurality of wing plates are configured to insert into, rotate and fasten in a fastening rotation hole of the electronic base board, and the securing unit comprises a clamping slot formed between the plurality of wing plates and the base and configured to clamp the electronic base board.

4. The fastener according to claim 1, wherein the elastically-compressive unit comprises an elastic plate connected to the pushing part, a pushing plate downwardly bent from the elastic plate and then extended toward the first direction and then extended and bent upwardly, an elastic space formed between the elastic plate and the pushing plate, fastening pins protruded on opposite inner sidewalls of the elastic plate and the pushing plate respectively, and an elastic device mounted on the two fastening pin and comprising a spring.

5. The fastener according to claim 4, wherein the pushing plate comprises a pushing surface recessed on an outer side thereof, and the pushing plate comprises a fastening protrusion disposed on a bottom side thereof and configured to insert to a fastening hole of an electronic base board.

6. The fastener according to claim 1, wherein the pushing part has a guiding incline formed on a top side thereof and configured to guide the circuit board to downwardly rotate, and the guiding incline is in a circular-arc shape.

7. The fastener according to claim 1, wherein the fastening member is a semicircular arc-sheet-shaped body, and the circuit board has a semicircular fastening groove corresponding in position to the fastening member, the fastening member is abutted with the fastening groove on a suspending board side of the circuit board for fastening, so as to form a fastening structure for the fastener and the circuit board.

8. The fastener according to claim 1, wherein the fastener is made by an insulative elastic material and in a one-piece structure.

9. The fastener according to claim 1, wherein the electronic base board comprises an electric connector disposed thereon and configured for the circuit board to plug thereon, so as to electrically connect the electronic base board and the circuit board.

10. The fastener according to claim 1, wherein the first direction, the second direction and the third direction are perpendicular to each other, and the third direction is opposite to the second direction.

* * * * *